United States Patent [19]

Gauthier

[11] 4,078,204
[45] Mar. 7, 1978

[54] DI-PHASE PULSE RECEIVING SYSTEM

[75] Inventor: John A. Gauthier, Brockville, Canada

[73] Assignee: GTE Automatic Electric (Canada) Limited, Brockville, Canada

[21] Appl. No.: 764,099

[22] Filed: Jan. 31, 1977

[51] Int. Cl.$^2$ .................. H03K 5/00; H03K 5/156
[52] U.S. Cl. ...................................... 328/21; 328/118; 328/150; 307/209; 307/261; 307/351
[58] Field of Search ............... 328/109, 118, 150, 119, 328/21; 307/351, 209, 261

[56] References Cited

U.S. PATENT DOCUMENTS

| 3,244,986 | 4/1966 | Rumble | 328/118 X |
| 3,610,982 | 10/1971 | Rall | 328/118 X |
| 3,820,031 | 6/1974 | Smithlin | 328/150 X |
| 3,969,677 | 7/1976 | Woyton | 328/118 X |

*Primary Examiner*—John S. Heyman

[57] ABSTRACT

The disclosure relates to a control means for converting serially transmitted di-phase data bits into parallel data bits having corresponding discrete logic levels. The control means of the present invention is adapted for use in a di-phase pulse receiving system of the type which includes a positive peak detector for providing a first pulse upon detecting a positive di-phase signal portion and a negative peak detector for providing a second pulse upon detecting a negative di-phase signal portion. The control means comprises a first set means coupled to the positive peak detector and responsive to the first pulses for being set upon the detection of a positive di-phase signal portion, a second set means coupled to the negative peak detector and responsive to the second pulses for being set upon the detection of a negative di-phase signal portion, and a shift register means having a first input coupled to the first set means, a second input coupled to the second set means, a clock input coupled to the positive detector for being clocked by the trailing edge of the first pulses, and a plurality of parallel outputs. The shift register means is responsive to the coincidence of the first and second set means being set upon being clocked to thereby shift a first logic level to the parallel output and is responsive to only the first set means being set upon being clocked to thereby shift a second logic level to the parallel output.

7 Claims, 8 Drawing Figures

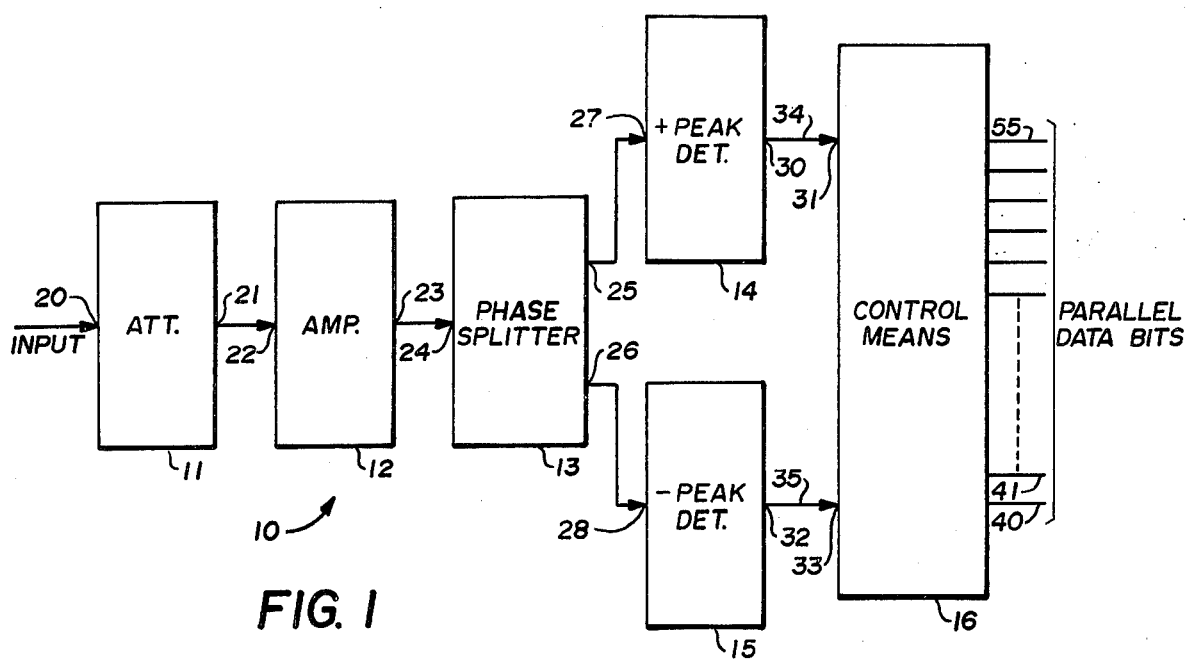
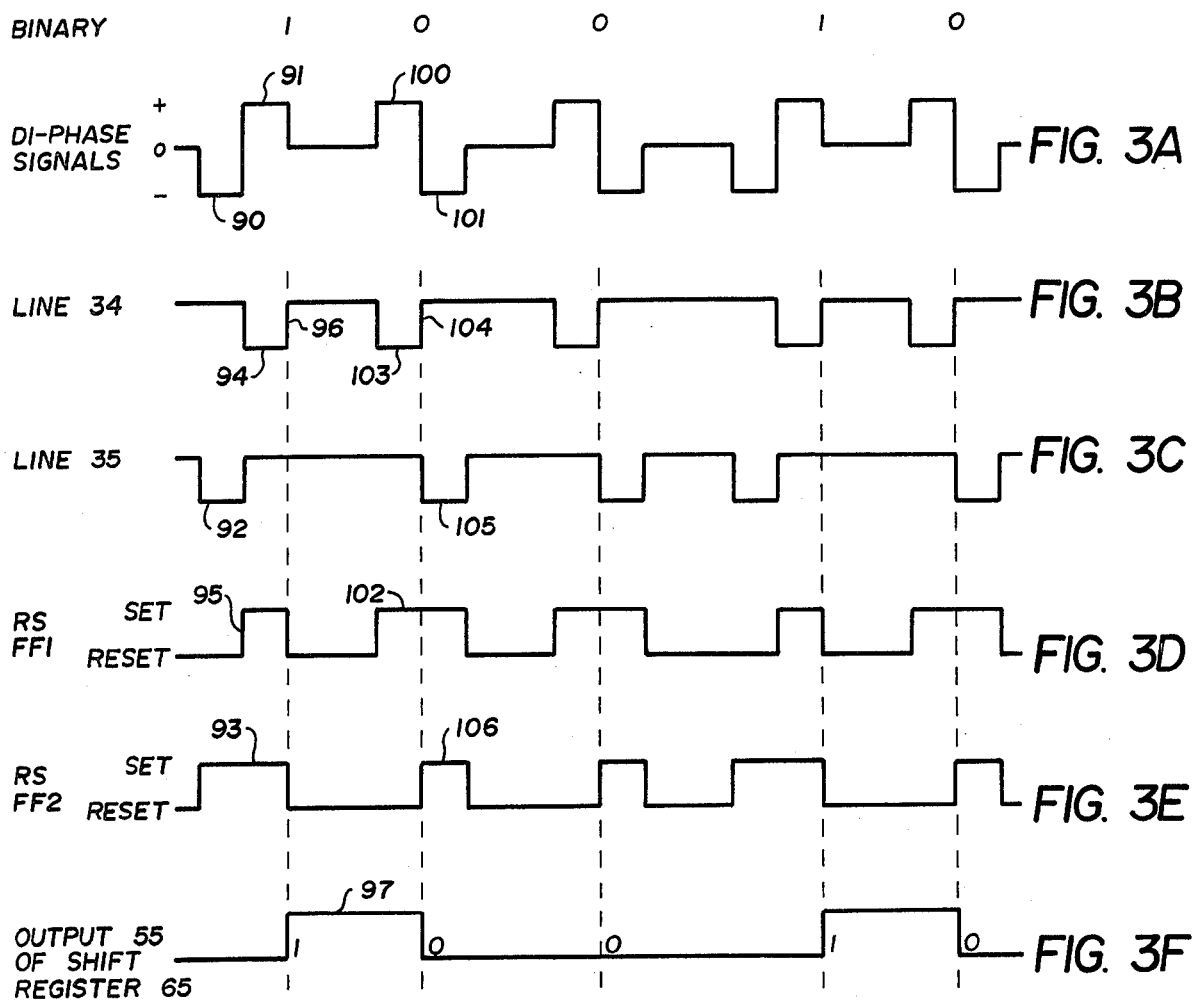

DI-PHASE PULSE RECEIVING SYSTEM

BACKGROUND OF THE INVENTION

The present invention is generally directed to a di-phase pulse receiving system of the type which receives a plurality of transmitted serial di-phase data bits and more particularly to a control means for such a receiving system for converting the serial di-phase data bits into parallel data bits having corresponding discrete logic levels.

Di-phase pulse transmission is well known in the art. In such transmission, a series of alternate positive and negative pulses are transmitted in pairs wherein the relative order of the positive and negative pulses of each pair defines a discrete logic level. For example, and as used in practicing the present invention, a pulse pair having a negative pulse preceding a positive pulse corresponds to a logical one bit and a pulse pair consisting of a positive pulse preceding a negative pulse corresponds to a logical 0 bit. Di-phase pulse transmission has found wide acceptance because there are as many positive pulses transmitted as negative pulses which thereby eliminates DC components.

In order to take full advantage of the di-phase pulse transmission technique, di-phase pulse receiving systems have been devised wherein the serial di-phase data bits are converted to corresponding discrete logic levels representing bits of information and made available to subsequent circuitry in parallel to afford action by the subsequent circuitry on the data bits.

Receiving di-phase data bits and converting them to parallel bits of corresponding discrete logic levels becomes difficult as the repetition rate of the di-phase pulse transmission increases. For example, at di-phase transmission rates on the order of 5 Megahertz, the reception and conversion of the di-phase pulses becomes extremely difficult. Di-phase pulse receiving systems of the prior art have experienced such difficulty. One reason for this is that the prior art di-phase pulse receiving systems have generally been complicated and thus overly cumbersome when receiving di-phase pulse transmissions at such a high rate.

It is, therefore, a general object of the present invention to provide a new and improved di-phase pulse receiving system which is capable of receiving di-phase pulse transmissions which are transmitted at high rates.

It is a particular object of the present invention to provide a new and improved control means for a di-phase pulse receiving system which renders the receiving system capable of receiving di-phase pulse transmissions at rates of 5 Megahertz and converts the serial di-phase data bits into parallel bits baving corresponding discrete logic levels.

It is a still further particular object of the present invention to provide a control means for a di-phase pulse receiving system which is relatively simple in design and which resets itself after receipt of each serial data bit of a di-phase pulse transmission.

SUMMARY OF THE INVENTION

The invention provides a control means in a di-phase pulse receiving system wherein the di-phase pulse receiving system is of the type which receives a plurality of transmitted serial di-phase data bits and of the type which includes a positive peak detector for providing a first pulse upon detecting a positive di-phase signal portion and a negative peak detector for providing a second pulse detecting a negative di-phase signal portion which control means converts the serial di-phase data bits into parallel data bits having corresponding discrete logic levels. The control means comprises first set means coupled to the positive peak detector and responsive to the first pulses for being set upon the detection of a positive di-phase siganl portion and a second set means coupled to the negative peak detector and responsive to the second pulses for being set upon the detection of a negative di-phase signal portion. The control means additionally includes a shift register means having a first input coupled to the first set means, a second input coupled to the second set means, a clock input coupled to the positive peak detector for being clocked by the trailing edge of the first pulses, and a plurality of parallel outputs, the shift register means being responsive to the coincidence of the first and second set means being set upon being clocked to thereby shift a first logic level to the parallel output and responsive to only the first set means being set upon being clocked to thereby shift a second logic level to the parallel output.

BRIEF DESCRIPTION OF THE DRAWINGS

The features of the present invention which are believed to be novel are set forth with particularity in the appended claims. The invention, together with further objects and advantages thereof, may best be understood by reference to the following description, taken in conjunction with the accompanying drawings, and in the several figures of which like reference numerals indicate identical elements and in which:

FIG. 1 is a block schematic diagram of a di-phase pulse receiving system incorporating a control means embodying the present invention;

FIG. 3A through 3F are representative way forms which may be utilized to further the understanding of the operation of the control means of the present invention.

DESCRIPTION OF THE PREFERRED EMBODIMENT

Figure 2:
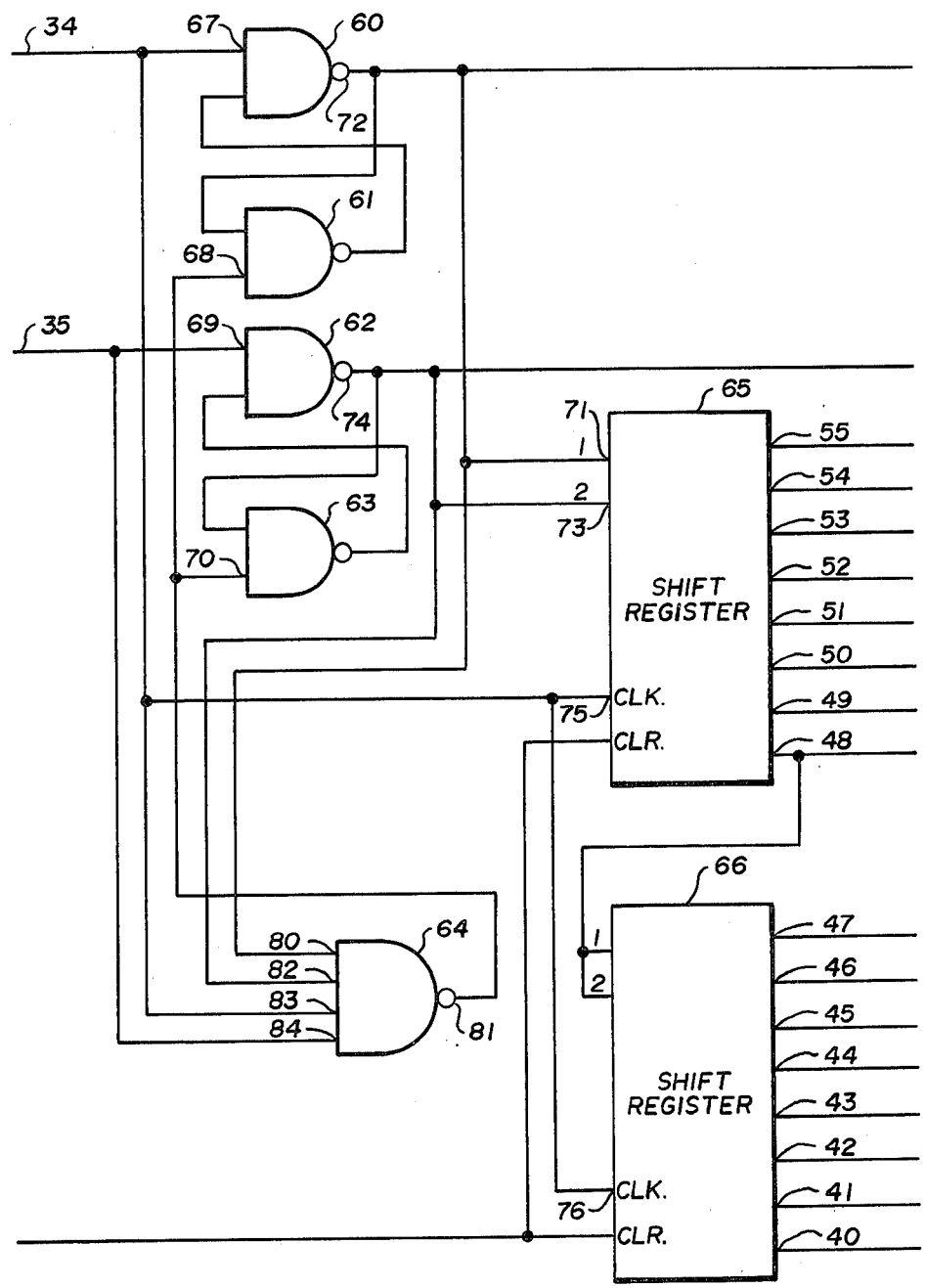
FIG. 2 is a detailed schematic circuit diagram of a control means embodying the present invention.

FIG. 1 shows a di-phase pulse receiving system 10 which embodies the control means of the present invention. The system 10 includes an attenuator 11, an amplifier 12, a phase splitter 13, a positive peak detector 14, a negative peak detector 15, and a control means 16 embodying the present invention. Attenuator 11 has an input 20 which constitutes the input to the di-phase pulse receiving system. Attenuator 11 has an output 21 coupled to input 22 of amplifier 12. Amplifier 12 in turn has an output 23 which is coupled to input 24 of phase splitter 13. Phase splitter 13 has a pair of outputs, output 25 and output 26. Output 25 is coupled to input 27 of positive peak detector 14 and output 26 is coupled to input 28 of negative peak detector 15. The positive peak detector 14 has an output 30 which is coupled to a first input 31 of control means 16 by line 34 and negative peak detector 15 has an output 32 coupled to a second input 33 of control means line 16 by line 35. Control means 16 has a plurality of parallel outputs 40-55.

For this preferred embodiment, control means 16 contains 16 outputs so that the di-phase pulse receiving system 10 may accommodate di-phase pulse transmissions containing up to 16 serial bits of data.

stage 14 and applied to terminal 19 of switch 16. If the value in memory 11 equals or exceeds that of N, the output signal at terminal 36 of comparator 13 will cause the transfer switch 16 to connect the transfer terminal 31 thereof with the input terminal 19. The adder 10 will have a new initial value. In this manner, the new initial value in adder 10 will be the difference between the value stored in memory 11 and the value N. Logically connected with the input signal $f_e$ at line 30 through inverter 34 and AND-gate 32, the output signal $f_a$ on line 31 will have the frequency divided signal appear thereat.

FIG. 2 illustrates a circuit as it can be actually constructed using commercially available integrated circuit elements. The adder 10 can be of the type CD 4008; memory 11 can be any standard memory; transfer switch 16 can be an AND/OR-gate of the type CD 4019. The comparison of the stored value in the memory 11 with the number N is carried out in an adder unit 40 connected to form, simulatneously, a comparating stage and a subtracting stage. The adder 40 can be similar to adder 10; a separate comparator, as shown in FIG. 1 for purposes of illustration of the operation, is then not needed since the subtraction can be related to a certain value to provide an output signal at that time.

The use of integrated circuits to construct the circuit elements with the function as shown and described in FIG. 1 thus shows that the entire unit can be integrated overall and built up as a single integrated circuit. A single component would then be provided in which the numerator as well as the denominator of the dividing circuit can be independently and separately controlled, connected as shown at N and Z in FIG. 2.

Various changes and modifications may be made within the scope of the inventive concept.

The invention will best be described in connection with an actual numerical example.

The object of the invention is to divide the input frequency $f_e$ on line 30 (FIG. 1) so that the output of AND-gate 32 will have the divided frequency $f_a$ appear thereat. The division ratio is given by the fraction Z/N. The numerator Z and the denominator N are quantities which are applied in binary form to the divider. Z is entered at line 26, N at line 18. As a limiting condition, Z must be less than or equal to N.

Let it be assumed that, at the beginning of the operation, the transfer input A of the adder 10 is zero; the input 25, that is, the B input of the adder [10] has a number Z in binary form. At the first pulse at the input frequency $f_e$, which is applied to input 30 at memory 11, the count state of the adder, in this case the number Z, is transferred into the memory. The output of the memory 11 now will have the value Z appear thereat. Comparator 13 compares the output in memory 11 with the numerator number N. At the same time, subtracting circuit 14 will form the difference between the count state of the memory 11 and the numerator N. If Z is less than N, no output will be derived from comparator 13 at terminal 36. The content in the memory 11 thus is transferred through transfer switch 16 in the position shown in FIG. 1 back to the A, 24 input of adder 10.

The adder 10 now will have at the input A the value Z; at the input B the value will likewise be Z. At the next pulse at the input frequency $f_e$, the sum 2Z will be transferred into memory 11. Comparator 13 will now make a new comparison with the denominator N, and subtracting circuit 14 will form a new difference between the content of memory 11, namely 2Z and the denominator N. This cycle will repeat until the output of the memory will have nZ applied thereto whereby nZ is a number which is at least equal to N (nZ ≧ N). The output 36 of comparator 13 will now provide a pulse which: (1) is connected to the input 37 of transfer switch 16 to cause connection between inputs 19 and 21 of the transfer switch and (2) provide a 1-signal at the input 35 of the AND-gate 32 so that, at the subsequent pulse at input frequency $f_e$, the input 33 of the AND-gate will be enabled to provide an output signal at terminal 31 of the AND-gate 32. If nZ = N, the output of the subtractor 14 will have the value 0. Due to transfer of the transfer switch 16, commanded by the signal at the input 37, the 0-value will also be applied to the input 24, that is, the A input of the adder 10. The previously described cycle will repeat. As an example, let it be assumed that division is by 10. The numerator Z then will be 1 (Z = 1) and the denominator will be 10 (N = 10) After the tenth pulse (n = 10), comparator 36 will enable the AND-gate 32 to pass the tenth pulse from line 30 to the output line 31.

The comparator will also provide a pulse when nZ is greater than N. The output 31 will then likewise provide a pulse, and transfer switch 16 will connect the input 19 with the output 21 as before. The subtractor 14 will, however, prevent a number which differs from zero, namely nZ − N. This number is now applied to the A input[24] of the adder 10. Let the number (nZ − N) = T. At the subsequent pulse $f_e$ to the memory 11, memory 11 will have the number T + Z stored therein, which number T + Z is compared in comparator 13 and subtracted in subtractor 14 from the number N. The transfer switch will change over and connect input 15 to the output 21 if the number T + Z is less than N. This cycle will repeat, as before, until T + nZ is greater than or equal to N. Again, a pulse will then be provided from comparator 36 and applied to the transfer switch 16 as well as to the AND-gate 32.

Assume a dividing ratio 3/7, that is, Z = 3, N = 7. Upon n = 3, the first pulse is provided, whereas the subtractor will provide number 2 (T) to the A input 24 of the adder 10. At the next $f_e$ pulse, the memory 11 will have the sum of the inputs A and B stored therein. The A, 24 input of adder 10 has 2; the Z number 3, in the example, is connected to the B input and 2 + 3 = 5 will be at the output of adder 10. At n = 2, output 31 of the AND-gate 32 will provide the next pulse since then T = nZ = 8, and the condition T = nZ is greater than N (= 7) has been met. The output 20 of the subtractor 14 will now have the number T = 1, which is applied to the A input 24 of the adder 10, and the cycle will repeat.

The value n of the number of pulses at the $f_e$ 30 input has been counted anew after each $f_a$ output pulse.

I claim:

1. Controlled frequency converter circuit to provide controlled division of the frequency of an input signal ($f_e$) by a fraction (Z/N) having an adder-memory (10, 11);

means (30) applying input pulses ($f_e$) representing said input signal to be divided to one input of said adder-memory (10, 11);

means (25, 26) applying signals in binary pulse form representing the numerator (Z) of the frequency division ratio to a numerator input (B) of said adder-memory (10, 11);

means (24) applying a transfer number to a transfer input (A) of said adder-memory;

3A). Upon receipt of the positive pulse 100, the positive peak detector 14 provides on line 34 a first signal in the form of a negative pulse 103 (FIG. 3B) which sets the first RS flip-flop as shown by the positive pulse 102 (FIG. 3D). Because the first RS flip-flop formed by NAND gates 60 and 61 is set, a logical 1 level signal is applied to the first input 71 of shift register 65.

As in the case of the trailing edge of pulse 96, the trailing edge 104 of pulse 103 clocks the clock input 75 of shift register 65. When the trailing edge 104 of pulse 103 clocks shift register 65, only the first input 71 will have attained the logical 1 level signal. The second input 73 which is coupled to the second RS flip-flop is not at a logical 1 level inasmuch as the second RS flip-flop has not yet been set. As a result, when the trailing edge 104 of pulse 103 clocks the shift register 65, the internal AND gate comprising inputs 71 and 73 will not be satisfied and thus will not shift a logical 1 level to output 55. Instead, shift register 65 will shift a logical 0 level to output 55. As a result, the logical 1 level previously shifted to output 55 will be shifted to output 54 thus resulting in output 54 being at a logical 1 level (the first bit received) and output 55 will be at a logical 0 level (the second bit received).

When the negative pulse 101 is received, the negative peak detector 15 will provide on line 35 a second pulse in the form of negative pulse 105 (FIG. 3C). The negative pulse 105 on line 35 will cause the second RS flip-flop to be set as represented by the positive going wave form 106 (FIG. 3E). The negative pulse 101 has no effect on the shift register 65 because the shift register has already been clocked by the trailing edge 104 of pulse 103. As a result, when the negative pulse 101 has terminated, the negative peak detector 15 will return to a logical level. When it does, all of the inputs 80–84 of NAND gate 64 will be at a logical 1 level and thus will cause NAND gate 64 to provide at output 81 a logical 0 level signal to reset the first and second RS flip-flops formed by NAND gates 60–63. As a result, the control means is reset, and made ready for receiving the next di-phase transmission bit.

The above procedure continues unitl all 16 bits of information have been received, converted to discrete logic levels, and shifted to the parallel output 40–55 of the shift register comprising shift register 65 and 66. At this point in time, each serial bit has been converted to a corresponding discrete logic level and made available at one of the parallel outputs 40–55 to be used by subsequent circuitry.

As can be seen from the foregoing, because the control means of the present invention is reset after each bit of information is received by the trailing edge of the pulses provided by the positive peak detector, any number of bits can be received at any time due to the fact that each bit is capable of synchronizing itself. However, for this preferred embodiment, the control means is particularly adapted for receiving serial di-phase data bits containing up to 16 bits of information.

The control means of the present invention is particularly useful for applications where noise might cause the receiving systems to get out of phase with the data bits. In such applications, the first two bits of the di-phase data transmission may be forced to opposite logic levels so that should one of the RS flip-flops be set due to noise, the opposite first two bits will always return the RS flip-flops back to their proper states. In doing so, only the first bit may not be received correctly. However, it must be pointed out, in such an application, only 15 of the 16 bits can actually be used to represent valid data. While this forces the first bit to be effectively sacrificed, this is done to assure that the last 15 bits are received as valid data.

While a particular embodiment of the present invention has been shown and described, modifications may be made, and it is intended in the appended claims to cover all such modifications as may fall within the true spirit and scope of the invention.

What is claimed is:

1. In a di-phase pulse receiving system of the type which receives a plurality of transmitted serial di-phase data bits and of the type which includes a positive peak detector for providing a first pulse upon detecting a positive di-phase signal portion and a negative peak detector for providing a second pulse upon detecting a negative di-phase signal portion, a control means for converting the serial di-phase data bits into parallel data bits having corresponding discrete logic levels, said control means comprising:

first set means coupled to the positive peak detector and responsive to the first pulses for being set upon the detection of a positive di-phase signal portion, second set means coupled to the negative peak detector and responsive to the second pulses for being set upon the detection of a negative di-phase signal portion, and shift register means having a first input coupled to said first set means, a second input coupled to said second set means, a clock input coupled to the positive peak detector for being clocked by the trailing edge of the first pulses, and a plurality of parallel outputs, said shift register means being responsive to the coincidence of said first and second set means being set upon being clocked to thereby shift a first logic level to said parallel outputs and responsive to only said first set means being set upon being clocked to thereby shift a second logic level to said parallel outputs.

2. A control means in accordance with claim 1 further including reset means for resetting said first and second set means and wherein said first set means includes a first reset input and said second set means includes a second reset input, said reset means comprising a first input coupled to the positive peak detector, a second input coupled to the negative peak detector, a third input coupled to said first set means, a fourth input coupled to said second means, and an output coupled to said reset inputs whereby, said reset means resets the control means after receipt of each di-phase data bit by resetting said first and second set means responsive to said first and second set means being set and the first and second pulses.

3. A control means in accordance with claim 2 wherein said reset means comprises a NAND gate.

4. A control means in accordance with claim 1 wherein first and second set means comprise RS flip-flops.

5. A control means in accordance with claim 1 wherein said shift register means comprises at least one shift register and wherein said shift register includes an AND gate comprising said first and second inputs for detecting the coincident set condition of said first and second set means.

6. In a di-phase pulse receiving system of the type which receives a plurality of transmitted serial di-phase data bits and of the type which includes a positive peak detector for providing a first pulse upon detecting a positive di-phase signal portion and a negative peak detector for providing a second pulse upon detecting a negative di-phase signal portion, a control means for converting the serial di-phase data bits into parallel data bits having corresponding discrete logic levels, said control means comprising:
- a first RS flip-flop having a first set input, a first reset input and an output, said first set input being coupled to the positive peak detector and responsive to the first pulses whereby upon the detection of a positive di-phase signal portion the positive peak detector sets said first RS flip-flop;
- a second RS flip-flop having a second set input, a second reset input, and an output, said second set input being coupled to the negative peak detector and responsive to the second pulses whereby upon the detection of a negative di-phase signal portion the negative peak detector sets said second RS flip-flop; and
- a shift register including an AND gate having a first input coupled to said first RS flip-flop output and a second input coupled to said second RS flip-flop output, a clock input coupled to the positive peak detector for being clocked by the trailing edge of the first pulses, and a plurality of parallel outputs, said AND gate being responsive to the coincident of said first and second RS flip-flops being in the set condition when said shift register is clocked at said clock input to cause said shift register to shift a first logic level to said parallel outputs and said AND gate being responsive to only said first RS flip-flop being in the set condition when said shift register is clocked at said clock input to cause said shift register to shift a second logic level to said parallel outputs.

7. A control means in accordance with claim 6 further including a reset means comprising a NAND gate, said NAND gate including a first input coupled to the positive peak detector, a second input coupled to the negative peak detector, a third input coupled to said first RS flip-flop output, a fourth input coupled to said second RS flip-flop output, and an output coupled to said first and second reset inputs whereby, said NAND gate resets the control means after receipt of each di-phase data bit by resetting said first and second RS flip-flops responsive to said first and second RS flip-flops being in the set condition and the first and second pulses.

* * * * *